United States Patent
Kunisawa et al.

(10) Patent No.: US 7,055,535 B2
(45) Date of Patent: Jun. 6, 2006

(54) HOLDING UNIT, PROCESSING APPARATUS AND HOLDING METHOD OF SUBSTRATES

(75) Inventors: Junji Kunisawa, Kanagawa (JP); Norio Kimura, Kanagawa (JP); Kenya Ito, Kanagawa (JP); Akira Fukunaga, Kanagawa (JP); Yuuki Inoue, Kanagawa (JP); Hiroshi Tomita, Kanagawa (JP); Soichi Nadahara, Kanagawa (JP); Motoyuki Sato, Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 10/629,678

(22) Filed: Jul. 30, 2003

(65) Prior Publication Data

US 2004/0016452 A1    Jan. 29, 2004

Related U.S. Application Data

(63) Continuation of application No. 09/984,791, filed on Oct. 31, 2001, now abandoned.

(30) Foreign Application Priority Data

Oct. 31, 2000  (JP) .............................. 2000-332163
Apr. 13, 2001  (JP) .............................. 2001-114947

(51) Int. Cl.
- B08B 3/08   (2006.01)
- B25B 11/00  (2006.01)
- H01L 21/306 (2006.01)

(52) U.S. Cl. ............... 134/157; 134/184; 134/902; 156/345.14; 269/21; 279/3

(58) Field of Classification Search ............. 134/61, 134/76, 79, 113, 137, 147, 149, 157, 902; 156/345.15, 345.16; 269/21; 279/3
See application file for complete search history.

(56) References Cited

U.S. PATENT DOCUMENTS

| | | | |
|---|---|---|---|
| 5,025,280 A * | 6/1991 | Lamb et al. ................ 396/571 |
| 5,324,012 A | 6/1994 | Aoyama et al. |
| 5,534,073 A | 7/1996 | Kinoshita et al. |
| 5,578,532 A | 11/1996 | van de Ven et al. |
| 5,620,525 A | 4/1997 | van de Ven et al. |
| 5,660,744 A * | 8/1997 | Sekine et al. ......... 219/121.43 |
| 5,925,411 A | 7/1999 | van de Ven et al. |
| 5,951,833 A * | 9/1999 | Yamagata .................. 204/198 |
| 6,164,133 A | 12/2000 | Watanabe |
| 6,202,655 B1 * | 3/2001 | Yamagata .................... 134/61 |
| 6,280,308 B1 | 8/2001 | Ishikawa et al. |
| 6,379,230 B1 | 4/2002 | Hayashi et al. |
| 6,428,620 B1 * | 8/2002 | Yamagata et al. ........... 117/97 |
| 6,547,938 B1 * | 4/2003 | Matsumura et al. ........ 204/225 |

FOREIGN PATENT DOCUMENTS

JP         03242919           10/1991

* cited by examiner

Primary Examiner—Joseph L. Perrin
(74) Attorney, Agent, or Firm—Wenderoth, Lind & Ponack, L.L.P.

(57) ABSTRACT

A holding unit holds a substrate to enable a surface of the substrate to be processed. The unit has a vacuum suction member that comes into contact with a peripheral portion of the surface of the substrate and sucks the substrate. A processing apparatus holds the wafer stably and allows an edge, a bevel portion and/or a back surface of the wafer to be processed.

11 Claims, 8 Drawing Sheets

HOLDING UNIT, PROCESSING APPARATUS AND HOLDING METHOD OF SUBSTRATES

This application is a continuation application of Ser. No. 09/984,791, filed Oct. 31,2001 now abandoned.

BACKGROUND OF THE INVENTION

The present invention relates to a holding unit, a processing apparatus and a holding method of a substrate, and more particularly to a holding unit, a processing apparatus and a holding method for processing a substrate, such as a semiconductor wafer, that requires a high degree of flatness and cleanliness.

Although aluminum or an aluminum alloy has been commonly used as a material for forming a wiring circuit on a semiconductor substrate, there has arisen a demand in association with the improved density in integration of semiconductor devices that a material having higher conductivity should be used as the wiring material. To meet that demand, a method has been suggested, in which first, a plating treatment is applied to a surface of a semiconductor substrate on which a circuit pattern groove and/or hole has been formed, so as to fill the pattern groove and/or hole with Cu (copper) or Cu-alloy, and second, the Cu or Cu-alloy is removed from the surface excluding the filled portions, thus forming circuit wiring.

To form this circuit wiring, first, a conductive layer is formed on the surface of the semiconductor substrate with a semiconductor element formed thereon. Second, an insulating film made of $SiO_2$ is deposited on the conductive layer. Third, contact holes and grooves for wiring are formed thereon by the use of lithography etching technology. Fourth, a barrier layer made of TiN or the like is formed thereon. Finally, a seeding layer is formed on the barrier layer so as to function as a feeding layer for the electrolytic plating.

By further applying Cu-plating to the top surface of the semiconductor substrate, the contact holes and/or the grooves of the semiconductor substrate can be filled with Cu while the Cu-plating film layer is deposited on the insulating film. Then, the Cu-plating film layer on the insulating film and the barrier layer are removed by chemical mechanical polishing (CMP), so that the surface of the Cu-plating film layer filling the contact holes and the grooves for wiring can be made approximately flush with the surface of the insulating film. Thereby, the wiring configuration consisting of a copper plating film layer is formed.

In this regard, it is to be noted that since the barrier layer and the seeding layer have been formed respectively to cover almost the entire surfaces of the insulating film or the barrier layer, there is a possibility that the copper film of the seeding layer will exist on a bevel (a circumferential portion) of the semiconductor substrate and/or that the copper forms a film and remains on an inner edge of the bevel (the circumferential portion) of the semiconductor substrate.

In practice, copper must be completely removed from the substrate; otherwise, there is a possibility that any copper that does remain, in certain semiconductor manufacturing processes such as an annealing process, for example, will readily diffuse into the insulating film, which may cause a deterioration in its insulating ability, or insufficient adhesion to a film to be formed subsequently, resulting in flaking.

SUMMARY OF THE INVENTION

In view of these problems, it is an object of the present invention to provide a holding unit, a processing apparatus and a holding method for a substrate, which facilitate processing on an edge or bevel portion and/or a back surface of the substrate, such as a wafer, and ensures that the substrate is held stable.

The present invention has been made with this object in mind and an aspect thereof is characterized by, for example, as shown in FIG. 4, a holding unit for holding a substrate W to enable processing of a surface of the substrate W. The holding unit comprises a vacuum suction member 48 to be brought into contact with an edge of one of the surfaces of the substrate W and to suck the substrate W. Thereby, the substrate can be held stably with the other surface, a side end portion of the substrate and the peripheral bevel portion on the one surface being exposed, so that a single process is sufficient to apply surface processing to a substrate in those respective locations at once.

Herein, the vacuum suction member 48 has a shape specified such that processing is not applied to any portion of the substrate to which processing should not be applied. For example, in a case that the substrate is a wafer having an element formed thereon (in a central portion excluding the edge portion thereof), preferably the vacuum suction member 48 should be formed so as to define a sucking position with respect to the wafer W such that processing, such as etching, is not applied to an element (device) forming section of the wafer W specified as the non-processing portion, on the substrate. It is further preferable that the shape of the vacuum suction member 48 be defined so as to allow the edge portion of the wafer to be treated as widely as possible, so far as processing is not applied to the element formed section.

Preferably, the vacuum suction member 48 has an annular groove 50 open in the side facing to the substrate W. In this case, the vacuum suction member 48 is typically annular in shape. More preferably, the vacuum suction member 48 and the groove 50 are each formed to be annular in shape.

Further, the vacuum suction member 48 is preferably attached to a back face of a disc-shaped holder plate 44 to be installed horizontally. Whereby, since the part of the flat surface defined within the inner side of the sucked surface of the substrate is covered by the vacuum suction member 48 and the holder plate 44, surface processing is not applied to that part on the surface, but only to the outside part thereof or the bevel portion of the sucked surface, the side end portion and the back face of the substrate.

Preferably, a portion of the vacuum suction member 48 to be brought into contact with the substrate W should be made of a material having a lower hardness as compared with that of the substrate W. This is to prevent any scratches from being created on the substrate surface, and also to ensure air tightness with some degree of tight contact to the substrate surface. A preferable material should be a resilient material such as natural rubber, synthetic rubber and flexible plastic, including fluorine-contained polymers such as PTFE, PFA, and PCTFE (Daifron: Daikin Co. Ltd.) having chemical resistant property and/or heat-resisting property, Kalrez (Dupont, Dow, elastomers, Co., Inc.), Chemraz (Greene, Tweed. Co. Inc.), and Viton (Dupont, Dow, elastomers, Co., Inc.).

Another configuration of the present invention is characterized by a processing apparatus of a substrate comprising the holding unit described above and a surface processing unit for applying processing to a surface of the substrate held by the holding unit. In addition, the processing apparatus of the substrate may further comprise a gas-liquid separation tank 56 which is connected to an exhaust path 52 for creating a vacuum in the vacuum suction member 48, and to a conduit 54, and functions for separating a mixture of liquid and exhaust gas sucked through the vacuum suction member 48 into gas and liquid.

Preferably, the substrate processing apparatus further comprises a unit for cleaning and/or drying the substrate. Still further, preferably, the substrate processing apparatus comprises an evaluation unit for checking the condition of the substrate after processing is complete, and for determining a resultant condition achieved by the processing. The processing apparatus of the substrate may further comprise a dipping bath for dipping the substrate held by the holding unit.

Another configuration of the present invention is characterized by a holding method for holding the substrate to apply processing onto a surface of the substrate, in which the vacuum suction member is brought into contact with an edge of one of the surfaces of the substrate so as to suck by vacuum and, thus, to hold the substrate.

In this specification, the term "edge" is used to refer to a peripheral portion on a surface of a substrate such as a semiconductor, where no device has been formed, typically a portion in a range within about 5 mm from a circumferential end portion on either of the top or the back surfaces of the substrate. Further, the term "bevel" designates a portion in a range of typically 0.5 mm or less from a side face portion or the circumferential end portion of the substrate having a curved shape in a sectional view or having been chamfered. In addition, a region covering the edge plus the bevel is also referred to as a circumferential portion. Any copper forming a film or adhering to the circumferential portion must be completely removed immediately after the copper-film forming process and/or the CMP process to avoid cross contamination in subsequent processes for conveying, storing and processing of the semiconductor substrate.

DETAILED DESCRIPTION OF THE INVENTION

Figure 1:
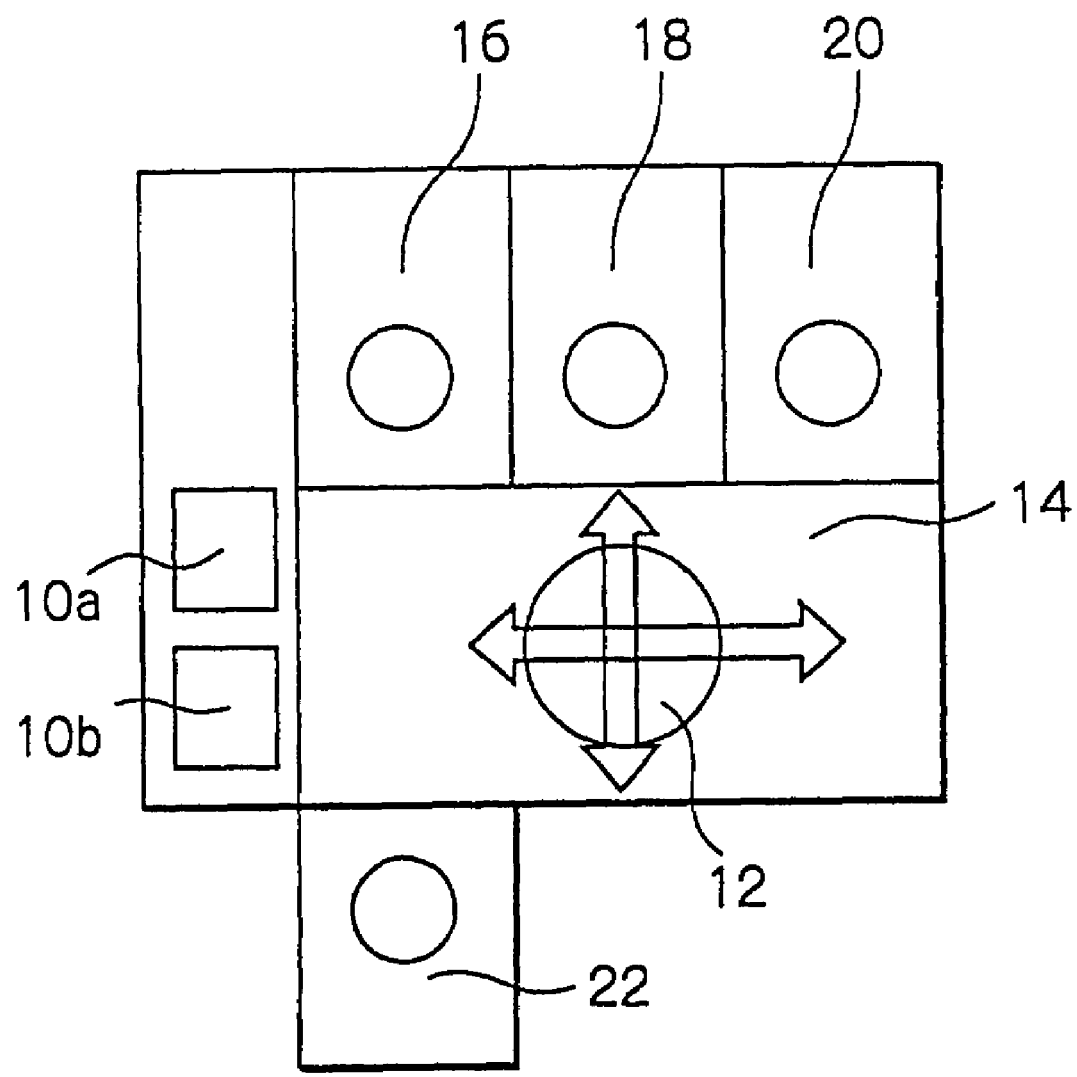
FIG. 1 is a plan view, illustrating a general configuration of an etching apparatus of a first embodiment according to the present invention.

Preferred embodiments of the present invention will now be described with reference to the attached drawings. FIG. 1 is an arrangement plan illustrating an overall configuration of an etching apparatus of an embodiment according to the present invention. This apparatus is used for etching a peripheral portion of a device formed region on a wafer surface, i.e., a circumferential portion thereof (a bevel portion and an edge portion), and a back surface of a wafer after, for example, CVD or deposition, such as sputtering or plating, and before the wafer is passed to the next process. One of the objects of this etching process is to remove any excessive film adhering to the back surface, bevel or notch portion during deposition.

This apparatus comprises cassettes 10a and 10b disposed in one end side thereof for receiving wafers, and one end functions as a base end, from which a traveling space 14 for a conveying robot 12 extends toward the other end. A drying unit 16, a cleaning unit 18, and an etching unit 20 are sequentially arranged in one side of the traveling space, and an inspection unit 22 is arranged in the other side of the traveling space 14. Preferably, the conveying robot 12 has at least two hands for handling a dry wafer and a wet wafer separately.

With reference to a schematic cross-sectional front elevation view of FIG. 2, the etching unit 20 functioning as a surface processing unit will now be described. This etching unit 20 comprises an etching bath 24 serving as a dipping bath or a surface processing section, a wafer holder 26 for holding a wafer W and their associated systems.

For the sake of convenience, in FIG. 2 as well as FIGS. 3 and 4, which will be referred to later, a vacuum suction member 48 is depicted in a larger scale relative to a substrate W or other components. In actual scaling, a width of the vacuum suction member 48 is in a range of 0.5 to 2 mm while a diameter of the substrate is 200 to 300 mm; and in one embodiment, the width of the vacuum suction member 48 is about 0.75 mm.

The etching bath 24 is cylindrical vessel having a base and comprises a heater 28 disposed in a specific location, for example, in a bottom portion for maintaining a constant temperature in the bath, and an etchant supply line 32 extending from an etchant reservoir tank 34 to the central region of the bottom portion of the bath 24 for supplying an etchant 30 into the bath 24 from the central region of the bottom thereof.

The etchant supply line 32 is provided with a pump 38 for pumping the etchant 30 into the etching bath 24, a concentration meter 51 (typically, a conductivity meter for liquid taking advantage of the fact that there is a correlation between the conductivity and the concentration in order to measure the concentration), an inline heater 36 for heating the etchant 30 or retaining the heat of the etchant 30, and a chemical filter 53. It is to be noted that neither the heater 28 nor the inline heater 36 need to necessarily be installed at the same time, and each may be mounted as desired. Further, the heaters may be connected to a thermal sensor and a temperature control unit, though not illustrated, to control the temperature of the etchant 30. In addition, a three-way valve 55 is installed in the line 32 between the chemical filter 53 and the bath 24. A third port of the three-way valve 55 to be in communication with other than the line 32 is coupled to a by-pass line 39, which is connected to the etchant reservoir tank 34.

A gutter 40 is arranged in an upper portion of the etching bath 24 for receiving any overflowed etchant 30, which is further provided with a recovery line 42 for guiding the overflowed etchant 30 into a specified receiver tank.

Further, the etching unit 20 comprises a transfer mechanism, though not shown, for moving either one of the wafer holder 26 serving as the holding unit and the bath 24 back or forth toward the other.

The wafer holder 26 comprises a holder plate 44 of horizontal disc-like shape and a cylinder portion 46 mounted thereon, which are allowed to rotate within a horizontal plane and also to move up and down by a driving mechanism which is not shown. The annular vacuum suction member 48 is attached to a lower face of the holder plate 44 along the circumferential portion thereof as shown in FIG. 3. The annular vacuum suction member 48 is made of resilient material such as natural rubber, synthetic rubber or a flexible plastic, as described above. A shape, size and material of the vacuum suction member 48 are designed, as will be described in detail later, so as to ensure that upon being compressed in the opening side of the groove against the substrate W to establish a predetermined degree of vacuum pressure within the groove, and to sufficiently resist excessive deformation, while providing good sealing to the substrate W, and thus to hold the substrate W stable.

The concentration meter 51 is used for monitoring a concentration of the etchant 30 to maintain the constant level of the concentration. The concentration can be controlled by supplying a liquid of high concentration or deionized water from a supply port, though not shown. The chemical filter 53 is used for filtering foreign substances such as products generated during processing of the substrate. The three-way valve 55 is used to switch the etchant supply line 32 from the line communicating with the etching bath 24 to the by-pass line 39 when no etching is undergoing. This switching allows the etchant to circulate from the reservoir tank 34 passing through the concentration meter 51, the heater 36 and the chemical filter 53 to the reservoir tank 34 again. This circulation helps maintain the temperature, concentration and cleanliness of the etchant in a condition suitable for use in the etching bath 34. It is to be noted that when the filter 53 is arranged downstream from the heater 36, it is able to filter any dust that may be generated in the heater 36.

A configuration of the vacuum suction member 48 will now be described with reference to a partial sectional view of FIG. 4. A groove 50 is formed in the vacuum suction member 48, which is an inverted V shape opening in the lower side of the vacuum suction member 48 along the centerline thereof. The groove 50 is configured by two ring-shaped members 48a and 48b each foiling a wall section of the inverted V shaped groove 50, respectively. The vacuum suction member 48 has at least two ring-shaped members 48a and 48b to form at least one groove 50 of annular shape (typically annular shape). It is to be noted that three or more ring-shaped members 48a and 48b may be employed in order to form two or more grooves 50.

Now, again referring to FIG. 2, the explanation will be continued. An exhaust path 52 open to the groove 50 is formed in the vacuum suction member 48 and the holder plate 44, and is in communication with a gas-liquid separation tank 56 or a scrubber via a rotary coupling arranged in the cylindrical portion 46, though not shown, and a conduit 54, and further connected to a vacuum source "Vac" such as a vacuum pump. A vacuum sensor 58 is installed in the exhaust path 52 or the like to detect a pressure within the groove 50 and thereby determine whether the wafer W has been properly held. It is to be noted that for better understanding of the exhaust path 52, which will be described later in more detail, the vacuum suction member 48, the holder plate 44 and the cylindrical portion 46 are all illustrated as partially cut away views.

The relationship between the vacuum suction member 48 and the wafer W will now be described more in detail with reference to FIG. 4. The wafer W has been formed in a disc-like shape comprising a top surface and a back surface (respective surfaces may be generically referred to as "surface" if appropriate) and a circumferential surface "C". The circumferential surface C consists of a cylindrical surface perpendicular to the top and the back surfaces and (a) chamfered section(s) or (a) bevel(s) "B" connecting the cylindrical surface to the top or the back surface. Alternatively, the circumferential surface C may be entirely formed in a circular arc shape in a sectional view. For either of the shapes, a part of the circumferential surface C having a largest diameter is referred to as an (circumferential) end portion.

A region on the top and the back surfaces of the substrate in a range from the end portion to about 5 mm inward from the end portion (with no device formed) is defined as an edge. Herein, for a disc-like wafer W, designating a diameter of the (circumferential) end portion as "D", an inner diameter of the circularly annular vacuum suction member 48 (an inner diameter of the ring-shaped member 48b) as "d1", an inner diameter of the circularly annular groove 50 (an outer diameter of the ring-shaped member 48b) as "d2" and an outer diameter of the circularly annular vacuum suction member 48 (an outer diameter of the ring-shaped member 48a) as "d3", a preferable relationship among these diameters will be the same as that of a case shown in FIG. 5, which will be described in further detail later with reference to FIG. 5.

It is preferable that the vacuum suction member 48 be designed to have a shape and size which will facilitate processing, such as the etching, without affecting an element (device) forming region on the substrate W. In addition, more preferably, the shape and size should be determined such that the edge portion can be processed to as great an extent as possible, so long as processing does not affect the element formed region.

The vacuum suction member 48, the holder plate 44 and the wafer W define a space surrounded by those components. That is, the vacuum suction member 48 is in contact with the wafer W in the vicinity of the circumference thereof but has no contact with the wafer W in other regions, so the space defined by the vacuum suction member 48 together with the holder plate 44 and the wafer W can be a hollow section.

The wafer to be processed has a specified standard size of, for example, 200 mm, 300 mm and so on, and also an associatively determined diameter D of the end portion. Accordingly, when a wafer has been selected, a corresponding inner diameter dI of the vacuum suction member 48 can be determined accordingly.

An etching process by the etching unit 20 constructed as described above will now be explained below with reference to FIG. 1 and others. After being subjected to the film forming process such as CVD, sputtering or plating, the wafers W are loaded on the cassette 10a or 10b with their device formed surfaces up. The cassettes 10a and 10b are then each then removed by a hand 60 of the conveying robot 12, which is used to carry a dry wafer to the etching unit as the robot 12 travels. At this time, the wafer holder 26 is in its lifted position, and the robot hand 60 moves forward to thus transfer the loaded wafer W to a location under the wafer holder 26, and positions the wafer W to be concentric with the holder 26, as shown in the partial sectional view of FIG. 3.

Figure 4:
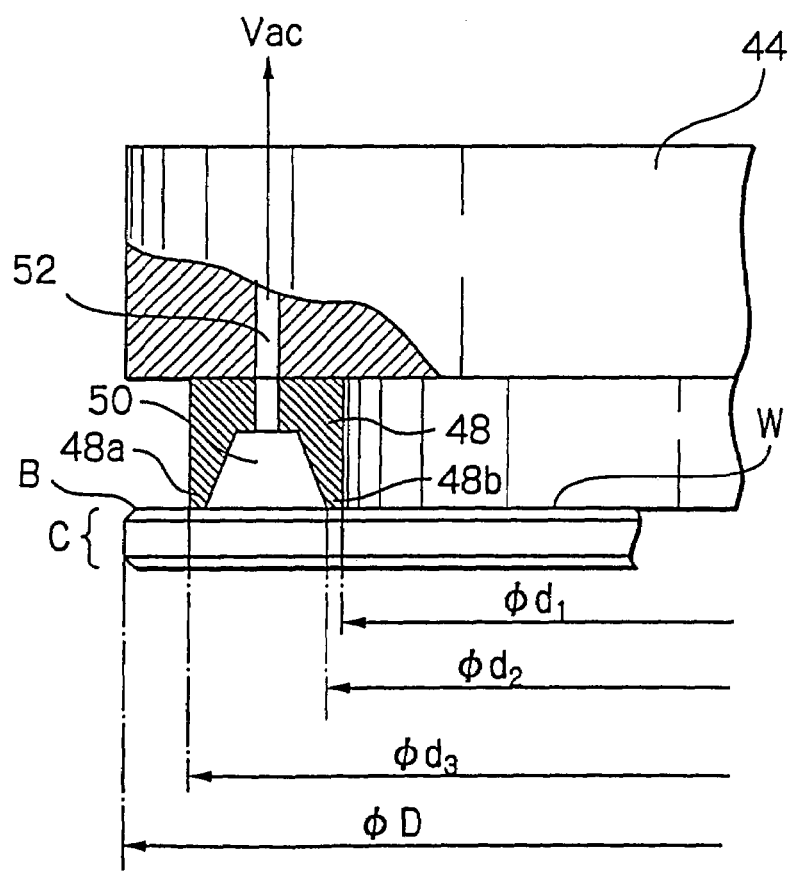
FIG. 4 is a partially cutaway view illustrating a part of a vacuum suction member for holding a wafer according to a first embodiment.

Then, the wafer holder 26 is moved down, and when the tip portion of the vacuum suction member 48 comes into contact with the wafer W, the valve 62 (FIG. 2) communicative with the vacuum source Vac is opened to generate a negative pressure in the space within the groove 50, whereby the wafer W is sucked and held by the wafer holder 26, as shown in FIG. 4. The vacuum sensor 58 installed in the exhaust path 52 or the like detects the pressure inside the groove 50 and determines that the wafer W has been held, and then the wafer holder 26 is moved up and the robot hand 60 is retracted. It is to be noted that a temporary loading table, which is not shown, may be provided within the unit; in which case, the wafer W can be transferred via that table.

Figure 2:
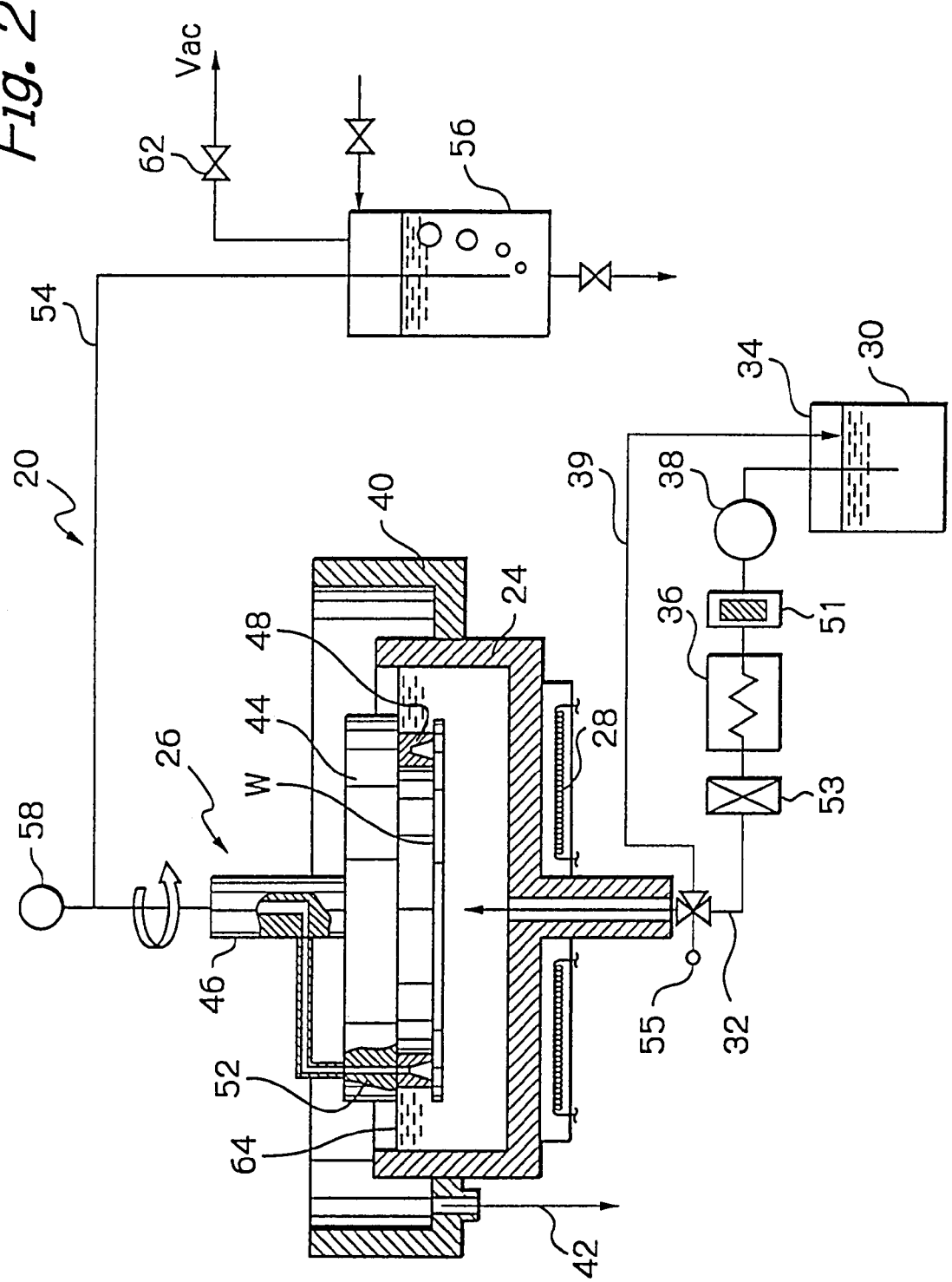
FIG. 2 is a schematic cross sectional front elevation view of an etching unit included in the etching apparatus of FIG. 1.
Figure 3:
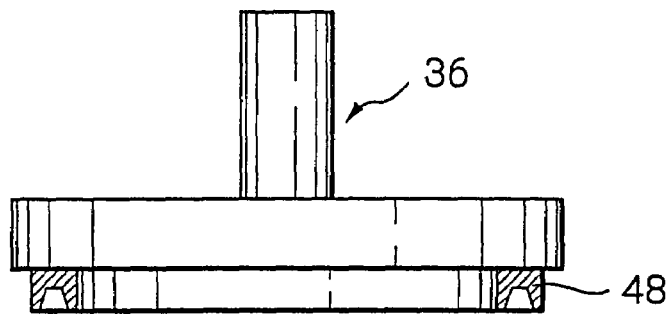
FIG. 3 shows a process for delivering a wafer.

The wafer holder 26 that has caught the wafer W is lowered again so as to dip the wafer W and at least a part of the vacuum suction member 48 into a bath liquid 64 in the etching bath 24, as shown in FIG. 2. The bath liquid 64 is constantly supplied with the etchant 30 through the etchant supply line 32, while the supplied etchant flows away from the peripheral portion of the bath 24, thus achieving a steady liquid flow, though a stationary bath may be employed. In the case of the stationary bath, an amount of the etchant should preferably not be more than 500 cc for the wafer W having the diameter of 200 or 300 mm. The bath liquid 64 composed of the etchant 30 is maintained at a certain temperature by controlling a calorific power of the heater 28 and/or the inline heater 36.

In the case of forming the steady liquid flow, setting a flow velocity between the bottom of the bath 24 and the wafer W to a predetermined value or greater may help prevent air bubbles from sticking on the wafer W. To increase the flow velocity, the distance between the bottom of the bath 24 and the wafer W should be reduced.

In either case, it is also possible to rotate the wafer holder 26 to maintain an appropriate liquid flow under the surface of the wafer W. A pre-treatment may be applied to the wafer W, including spraying a surfactant and irradiating a plasma against the surface thereof, before the wafer W is dipped into the etchant 30, to improve conformability between the surface of the wafer W and the etchant 30. Turning the wafer holder 26 can increase the relative velocity of the etchant with respect to the wafer W, and thus can prevent the air bubbles from sticking to the wafer W.

According to this unit, since the etchant is prohibited from flowing into the inner region on the upper surface of the wafer W covered by the vacuum suction member 48, the device formed surface can be shielded without being etched. On the other hand, the bevel portion B (see FIG. 4) on the top surface, the end face and the back surface of the wafer W can be etched all at once, and the surface layer can be removed by an amount corresponding to the length of the process time or the like together with deposits such as fine particles.

In this unit, even if the sealing property between the contact section of the vacuum suction member 48 and the wafer W were managed carefully, it is difficult to completely prevent the etchant from leaking through the gap therebetween. The leaked etchant is guided through the exhaust path 52 to the gas-liquid separation tank 56 or the scrubber, which separates it into gas and liquid, thus eliminating the affection of the leaked etchant to the vacuum source such as the vacuum pump.

After having finished the etching process, the wafer W is provided with a necessary post-treatment or rinsed with deionized water. Then, the wafer is handled through a procedure inverse to a prior loading procedure to be transferred to the robot hand used for a wet wafer W, which conveys the wafer to the cleaning unit 18. In the cleaning unit 18, a cleaning method such as, if desired, scrubbing or a high pressure jet spray of deionized water is employed to clean the top and the back surfaces of the wafer W. In this processing, light-etching by chemicals may be applied to the wafer W as desired. After having finished the cleaning process, the wafer W is further transferred by the robot 12 to the drying unit 16, which uses a spin-drying, a clean air jet or the like to dry the wafer W. After having been dried, the wafer W is returned to the cassette 10a or 10b by the robot hand used for the dry wafer.

In the course of carrying out the processes described above, after either one of the etching, the cleaning and the drying processes, the wafer W is transferred to the inspection unit 22 to determine whether or not the predetermined etching treatment has been successfully achieved. The inspection unit 22 may be such an appropriate unit in practice that comprises, for example, a CCD camera and a computer for imaging an output from the CCD camera. A result determined as either pass or fail is stored in the computer, and the subsequent process in response to the result applies a suitable processing to the wafer W. If the result is determined a failure, the preceding processes may be applied again to the wafer W before returning the wafer W to the cassette 10a or 10b, or alternatively such a means may be employed that a requirement for the process, such as the etching, may be sent as feedback for processing a next wafer W.

Figure 5:
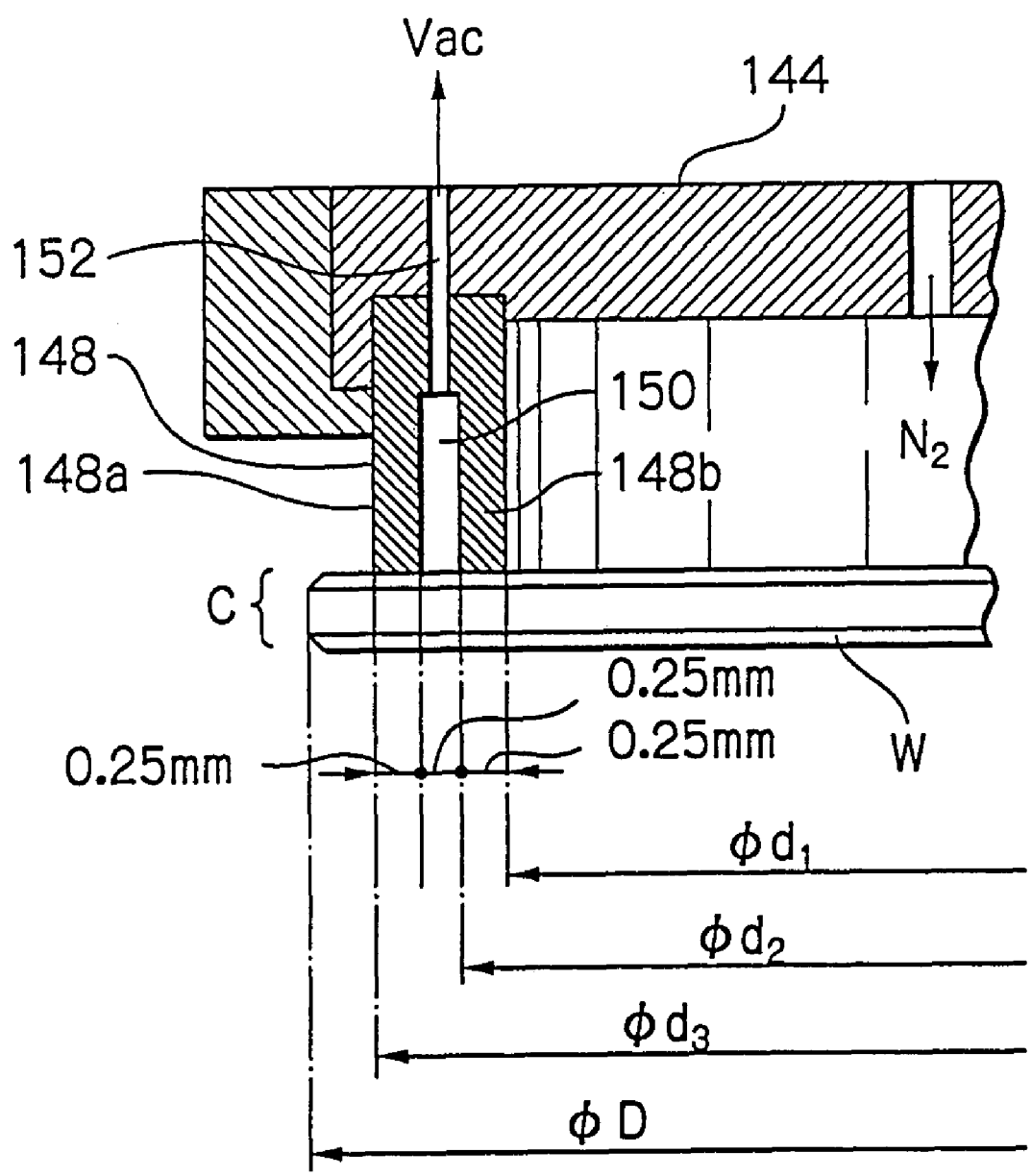
FIG. 5 is a partially cutaway view illustrating a part of a vacuum suction member for holding a wafer according to a second embodiment.

Now, referring to the partial cross-sectional view of FIG. 5, a configuration of an alternative vacuum suction member 148 different from that in FIG. 4 will be described. A groove 150 is formed in the vacuum suction member 148, which is rectangular shape in a sectional view and opened in the lower side along the centerline thereof The groove 150 is configured by two ring-shaped members 148a and 148b each forming a wall section of the groove 150, respectively. Although the vacuum suction member 148 may have at least two ring-shaped members 148a and 148b in order to form at least one groove 150 of annular shape (typically annular shape), three or more ring-shaped members 148a and 148b may be employed, as is the case in FIG. 4.

An exhaust path 152 open to the groove 150 is formed in the vacuum suction member 148 and a horizontal disc-like holder plate 144 for holding the vacuum suction member 148, which is in communication with the gas-liquid separation tank 56 or the scrubber as described above, and further connected to the vacuum source "Vac" through them. An operation for sucking and holding the wafer W is the same as that of the vacuum suction member 48, and a duplicated explanation will be omitted.

The vacuum suction member 148 is similar to the vacuum suction member 48 in those points that the vacuum suction member 148, the holder plate 144 and the wafer W define a space surrounded by these components and that the vacuum suction member 148 is in contact with the wafer W in the vicinity of the circumference thereof, but has no contact points on other regions of the wafer so that the space defined by the vacuum suction member 148 together with the holder 144 and the wafer W can be a hollow section. Further, in this embodiment, a nitrogen ($N_2$) purging aperture is provided in the holder plate 144 so that the region on the upper face (the top surface) of the wafer W covered by the vacuum suction member 148, i.e., the hollow section, can be purged by blowing $N_2$ gas thereinto.

Further referring to FIG. 5, the relationship between the vacuum suction member 148 and the wafer W will now be described. The illustrated wafer W has a circumferential face C that is round in shape as a whole. It should be appreciated that the circumferential face C may be the one in the preceding description that has been chamfered. Herein, for a disc-like wafer W, a diameter of the (circumferential) end portion is designated as "D", an inner diameter of the circularly annular vacuum suction member 148 (an inner diameter of the ring-shaped member 148b) as "d1", an inner diameter of the circularly annular groove 150 (an outer diameter of the ring-shaped member 148b) as "d2" and an outer diameter of the circularly annular vacuum suction member 148 (an outer diameter of the ring-shaped member 148a) as "d3". In one embodiment, the vacuum suction member 148 is designed such that (d3−d1)/2=0.75 mm, which means the thickness of the vacuum suction member 148 is 0.75 mm, and (d2−d1)/2=0.25 mm, which means the wall thickness of the ring-shaped member 148b is 0.25 mm. The ring-shaped member 148a is also made with a thickness of 0.25 mm similarly to the ring-shaped member 148b. Accordingly, a width of the circularly annular groove 150 may be calculated as 0.75−(0.25+0.25)=0.25.

Further, for D=200 mm, it was determined d3=194 mm, accordingly (D−d3)/2=3.0 mm. In this case, (D−d2)/2=3.5 mm. With this condition applied, when the groove 150 was evacuated to a vacuum and the wafer W was dipped into the etching bath while purging the inside of the vacuum suction member 148 by blowing $N_2$ gas thereinto, the outside of the ring-shaped member 148b (the outside of the diameter d2) of the wafer W was etched, but the contact region with the ring-shaped member 148 and the region inside thereof remained unetched. This is due to the vacuum in the groove 150. The contact region of the ring-shaped member 148a with the wafer W allows the outer etchant to pass therethrough, while the contact region of the ring-shaped member 148b with the wafer W allows the inner $N_2$ gas to pass therethrough, thus shielding the inside from the enchant.

In other words, according to this embodiment, in the case where the annular groove 150 formed as interposed between the outer ring-shaped member 148a and the inner ring-shaped member 148b is evacuated to a vacuum so as to suck the wafer W while the inside region of the inner ring-shaped member 148b is purged with $N_2$ gas, the outer diameter of the inner ring-shaped member 148b (the inner diameter of the annular groove 150), d2, should be set to be outside with respect to the region to which no etching effect is expected (typically, the region in which the element (circuit) has been formed). On the other hand, since the portion with no circuit formed thereon should be etched to as great an extent as possible, the diameter d2 is expected to be as near as possible to a diameter of a circle defining a boundary between a region with a circuit formed thereon and another region with no circuit. Specifically, D−d2=3.0~4.0 mm is recommended, and typically, a dimension of about 3.5 mm is preferred.

As described, since the wafer to be processed has a standard size determined as 200 mm, 300 mm and so on, once a certain wafer is determined to be subject, the outer diameter of the inner ring-shaped member of the vacuum suction member 148, d2, can be determined corresponding to the size of the wafer. The width of the annular vacuum suction member 148 is in a range of 0.5~2.0 mm, preferably in a range of 0.5~1.0 mm, and more preferably about 0.75 mm. It is to be noted that although the sectional shape of the groove 150 is elongated and rectangular, the groove 150 may be formed in an inversed V shape similar to the groove 50.

With reference to a schematic cross sectional front elevation view of FIG. 6, a configuration and an operation of an etching unit 200 and peripheral devices thereof according to an embodiment of the present invention will now be described. The etching unit 200 essentially comprises: a wafer stage 201 for receiving and delivering a wafer and for loading the processed wafer thereon to be cleaned; an etching bath 221 serving as a dipping bath for applying the etching process therein; a wafer holder 241 for holding the wafer W subject to the etching and for moving the wafer W between the wafer stage 201 and the etching bath 221; a cup 208 arranged so as to surround nozzles 202 and 203 for discharging wafer cleaning liquid and the stage 201 for preventing the liquid from splashing away; and a frame (not shown) for accommodating those components. The unit 200 is coupled with a liquid supply system including a reservoir tank for chemical liquid such as an etchant $C_s$ (not shown in FIG. 6) and a chemical liquid pressure pump (not shown in FIG. 6) so as to supply and/or recover the chemical liquid.

The wafer holder 241 for holding the subject to be etched, that is the wafer W in this embodiment, includes a holding face having a vacuum suction member 148 for holding the wafer W, a mechanism for moving the holding face horizontally between the stage 201 and the etching bath 221, an elevating mechanism, and a shaft for rotating the holding face and a driving source thereof. In the unit used in the embodiment illustrated in FIG. 6, the wafer holder 241 is allowed to travel horizontally by a drive motor 291 for horizontal movement and a ball screw 263 between two points: a stage position for receiving/delivering the wafer W from/to an external component other than the etching unit 200, and an etching bath position for applying the etching process. Further, the vertical movement operation is controlled by an air cylinder 261, to position the holding face of the wafer W at either of two height levels, where one level is to be identical to that of the position for receiving/delivering the wafer W on the stage 201 and the other level is to be identical to that of the lifted position during travel between the etching bath 221 and the stage 201. In addition, a rotary mechanism can be provided around the air cylinder 261 placing it as a center of rotary motion to accomplish the horizontal travel.

Figure 6:
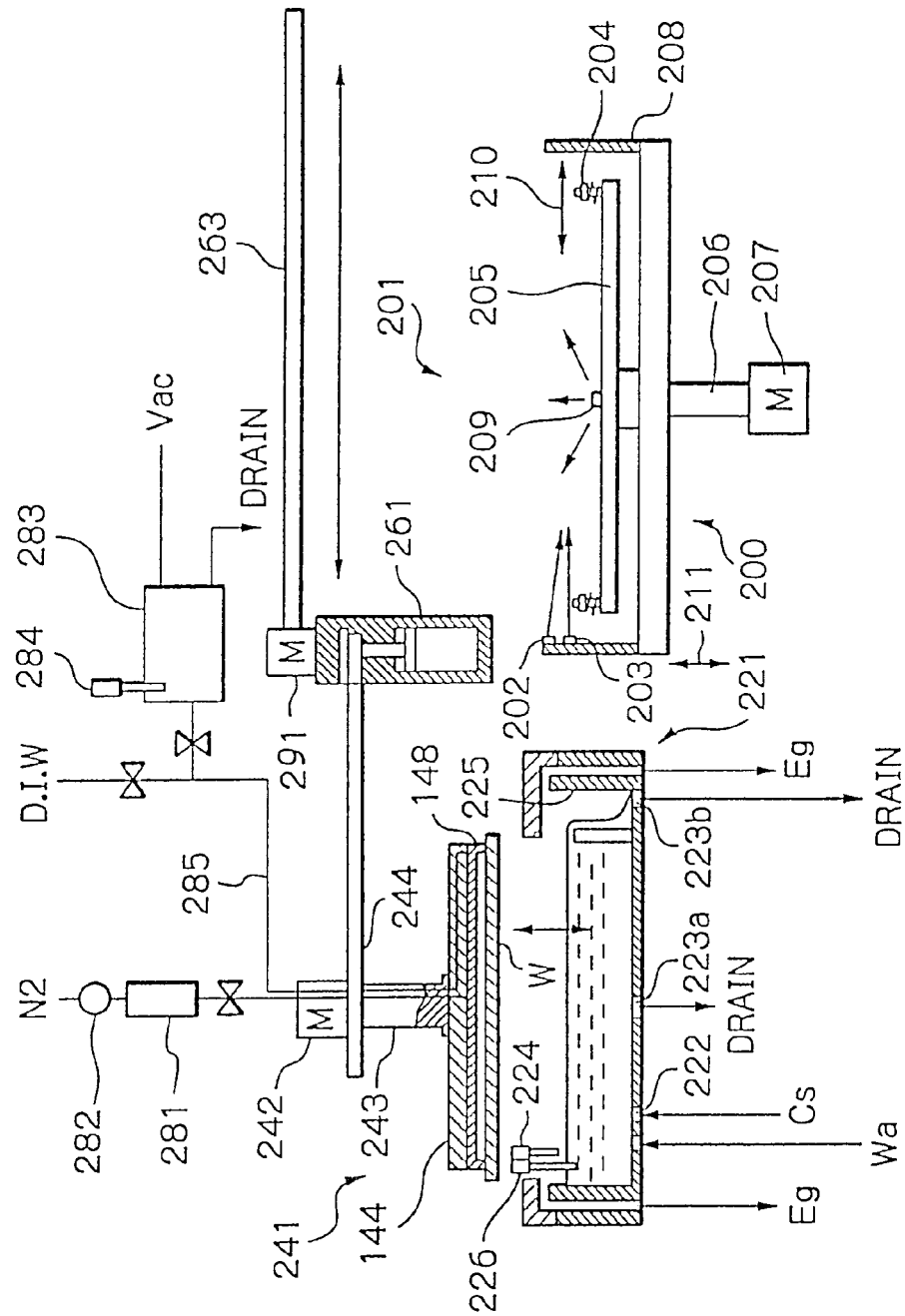
FIG. 6 is a schematic cross sectional front elevation view of an etching unit of an embodiment according to the present invention.

It is to be noted that although in FIG. 6, the etching position for applying the etching process is shown at the same height level as the position for receiving/delivering the wafer W, the etching position may be determined to be a different level. Further, a rotary shaft motor 242 enables the holding face to rotate at a rotational speed of 0 to 500 revolutions/min. To explain in further detail, the wafer holder 241 for holding the wafer W comprises a horizontal disc-like holder plate 144 and a cylindrical rotary shaft 243 mounted thereon in its central portion. An upper end of the rotary shaft 243 is coupled to the rotary shaft motor 242 attached to one end of a horizontally extending arm 244, so that the rotary shaft 243 can be rotated by the motor 242. The other end of the arm 244 is coupled to a piston of the air cylinder 261 so that the arm 244 can be moved in the up and down directions by the piston and also in the rotary direction around a piston rod as centered. Further, the annular vacuum suction member 148 is attached to the back surface of the holder plate 144 along the peripheral edge portion thereof, as has already been described.

The stage 201 for receiving/delivering the wafer W comprises a rotary table 205 having a rotary face arranged horizontally which includes a plurality of pins 204 attached thereon for supporting the peripheral edge portion of the loaded wafer W. A rotary shaft 206 is fixed to the under face of the rotary table 205 upright in a central portion thereof, and the rotary shaft 206 is coupled with a rotary shaft motor 207 so as to be driven rotationally thereby.

The rotary table 205 with the pins 204 may function as a relay table upon receiving/delivering the wafer W between the wafer holder 241 and a robot hand 210 and also may function as a table on which the wafer W is loaded upon cleaning the top and the back surfaces of the wafer while allowing the wafer W to be rotated during cleaning. The rotational speed is in a range of 0 to 3000 revolutions/min. It is to be noted that the robot hand 210 is illustrated in FIG. 6 with the direction of its movement designated by a horizontally bi-directional arrow. It is to be further noted that although the robot hand 210 is shown as if it were penetrating through the cup 208, in practice, the cup 208 and a shutter, which is not shown, are moved down cooperatively (see a vertical bi-directional arrow 211) to permit the robot hand 210 to access a location above the rotary table 205.

It is to be appreciated that the wafer stage 201 may employ configurations other than that of the illustrated one having the pins and the rotary table, and it may comprise, for example, six supporting shafts (not illustrated) each of which is operatively attached vertically onto the wafer stage so as to be capable of rotating and is configured to catch the loaded wafer W in the peripheral portion thereof. The wafer W may be loaded at upper end portions of those supporting shafts and allowed to rotate as the supporting shafts rotate.

The etching bath 221 for applying the etching process has a supply port 222 for supplying the etchant $C_s$ and a drainage hole (DRAIN) 223a in a bottom portion of the bath. Further, a liquid level sensor 224 is attached to the bath in an upper location thereof so as to detect a full level, i.e., an overflow, of the etchant in the etching bath 221 and a drainage of the etchant. The etching bath 221 is a cylindrical vessel having a base, and an etchant supply line is provided so as to establish a communication between the etchant reservoir tank (not shown in FIG. 6) and the etching bath 221.

The etching bath 221 is provided with a gutter 225 arranged in a side portion thereof for receiving overflowed etchant, and the gutter 225 has a drainage hole (DRAIN) 223b penetrating therethrough, to which a recovery line is connected for recovering overflow etchant into the etchant reservoir tank (not shown in FIG. 6). Also, the etchant drained from the drainage hole 223a in the bottom portion of the etching bath joins into the same recovery line. It is to be noted that the etchant supply line may also be used as a flow path for supplying the deionized water $W_a$ into the etching bath 221.

A thermo-couple 226 is attached to the etching bath 221 for measuring a liquid temperature within the bath so as to see whether or not the etchant has reached to a temperature suitable for processing.

The cup 208 surrounding the stage 201 is provided with two nozzles; one is the nozzle 202 for cleaning a top-surface of the wafer and the other is the nozzle 203 for cleaning a side-face of the wafer. Also, the stage 201 in its central portion is provided with another nozzle 209 for cleaning a back surface of the wafer, serving as a discharge port directed upward so as to eject a cleaning liquid to be used for cleaning the back surface of the wafer W. Although in the above embodiment deionized water is used as the cleaning water, the nozzles may be connected to other chemical lines. It is to be noted that the cup 208 is disposed in an outer periphery with respect to the stage 201 supporting the wafer W, and during the wafer W being processed, the cup 208 is lifted up so as to cover the stage 201, thus preventing cleaning liquid from splashing away over the cup 208. The lifting and lowering motion of the cup 208 is controlled by an air cylinder, though not shown.

It is to be noted that the non-illustrated shutter is attached to the cup 208 and moves up or down in association with the lifting and lowering motion of the cup. This shutter is in contact with a side face of a not-illustrated frame, and has a geometric relationship.

The frame for accommodating the unit can receive and support all of the aforementioned mechanisms and a side face of the frame has an opening for carrying/taking the wafer in/out of the frame. The shutter is in contact with an inner side of the side face portion of the frame having the carrying in/taking out opening, and in operation, the opening remains open when the cup 208 has been lowered, but would be blocked by the shutter sliding up when the cup has been lifted up.

The unit of FIG. 6 operates generally in the following manner. First, the wafer W to be etched is set on the stage 201. Then, the wafer holder 241 sucks and thus holds the wafer W with the vacuum suction member 148, and transfers the wafer W to the etching bath 221, in which the wafer W is etched while being held by the wafer holder 241. Then, after a rough cleaning (a rinse) having been applied to the wafer W within the etching bath 221, the wafer W is transferred onto the stage 201, in which a main cleaning operation is carried out with the deionized water being applied to the wafer W to finish the process, and the wafer W is now ready to be taken to the outside.

In conjunction, operations of the peripheral devices and the components during the operation will be described below in detail. First, the wafer W subject to etching, as in the state of being loaded on the robot hand 210, is carried by the robot to the main etching unit 200. At that point in time, the wafer holder 241 is in a standby state at the lifted position above the etching bath 221.

The robot hand 210 is introduced into the etching unit 200 along the level of the upper face of the stage 201 through the opening for carrying in/taking out the wafer arranged in the side face of the frame. The robot hand 210, after having reached to the location right above the stage 201, is lowered to place the wafer W on the stage 201. The robot hand 210 having been lowered to a level lower than the wafer W is retracted through the opening.

When the retraction of the robot hand has been completed, the wafer holder 241 is moved horizontally to the location above the stage 201 and then the wafer holder 241 is lowered to the level of the stage 201. At that time, the wafer holder 241 comes in contact with the peripheral edge portion of the wafer W at the vacuum suction member 148, which seals the holding section of the wafer holder 241, and sucks the wafer W by vacuum. Preferably, the pressure at this time should be in a range of not greater than −80 kPa.

After that, the space formed by the vacuum suction member 148 and the top surface of the wafer W is supplied with $N_2$ gas to increase pressure within the space, while the exhaust gas $E_g$ is discharged from the upper peripheral portion of the etching bath 221, so that the etchant may be prohibited from wrapping around and entering into the interior space. This $N_2$ gas hardly increases the pressure as compared with the ambient pressure. By supplying the $N_2$ gas in such a manner, the vacuum suction pressure of the sealing section comes into a range of −60 kPa or lower. Under this condition, the wafer holder 241 is moved up by the air cylinder 261 and further moved in the horizontal direction to the location above the etching bath 221, where the wafer holder 241 is lowered to the etching position.

Subsequently, the etching bath 221 is supplied with the etchant $C_s$, the temperature of the etchant is detected by the thermo-couple 226 to see that the detected temperature is at a predetermined level, and it is ensured by using the liquid level sensor 224 that the bath has been filled with a sufficient amount of etchant. After these have been ensured, the etching process is applied for a certain period of time while rotating the holding face of the wafer holder 241 at a rotational speed of about 0 to 50 revolutions/min. and also supplying the etchant. It is to be noted that the etching time may be determined arbitrarily.

In a case where the film on the wafer to be etched was $Ta_2O_5$ film with a thickness of 200 angstroms, a good etching result was obtained with the etchant of DHF by 5%, the etchant temperature of 50° C. to 80° C., and the etching time of one minute. Further, rotating the holding face of the wafer holder 241 during etching can prevent the air bubbles generated by the etching reaction from being retained on the wafer W, and thus is able to prevent uneven etching. In addition, the continuous supply of the etchant $C_s$ during etching is also effective. For example, supplying the etchant at a flow rate of 800 to 1000 cc/min has been found effective.

When the predetermined etching time has passed, the etchant is discharged and the same etching bath is now supplied with the deionized water $W_a$ to roughly clean the wafer W and the portion around the sealing section of the wafer holder 241. This rough cleaning time may also be determined arbitrarily. When the rough cleaning has been completed, the rinse liquid in the etching bath 221 is discharged, and the wafer holder is lifted up and then moved to the location above the stage 201. At this point of time, the cup 208 is moved up, and the deionized water is injected from the cleaning liquid supply nozzle 203 for the wafer side-face against the back surface and edge portion of the wafer W so as to perform the cleaning. Then, the wafer holder 241 is lowered to the level of the stage 201 to release the suction. At this time, the release of the wafer W and the cleaning of the interior of the sealing portion of the wafer holder 241 can be performed at the same time by supplying the deionized water (D.I.W.) to the vacuum line, which has been used to suck the wafer W, in a direction toward the wafer holding surface.

After the wafer W has been loaded on the stage 201, the top and the back surfaces of the wafer are cleaned by injecting deionized water from the nozzle 202 to thereby clean the wafer top-surface (upper face) and the central discharge port 209 of the stage 201.

When all of the processes including etching prior to cleaning have been completed in the manner as described above, the robot is directed toward the unit in order to receive the wafer W. In the etching unit 200, the cup 208 of the stage is lowered. In this way, as the opening arranged in the side face of the frame for receiving/delivering the wafer is opened, the robot hand 210 is inserted at the level lower than the wafer and then moved up from this state to scoop the wafer out of the stage, and the hand is contracted to bring the wafer to the outside.

The above explanation has been directed to the etching of the $Ta_2O_5$ film, but the unit of the present invention can be applied for etching other kinds of film by exchanging the etchant. For example, for a Ru film, a solution of ammonium cerium nitrate by 20% may be supplied as the etchant. For a TiN film, hydrochloric acid, hydrogen peroxide water, and deionized water may be mixed by a ratio of, for example, 1:1:5 just before supply and then supplied. In either case, the etchant may be heated to 50° C. to 80° C. and then supplied. Further, although in this description $N_2$ gas is supplied to prevent wraparound and entering of the etchant and vapor, air or another gas may be used.

Figure 7:
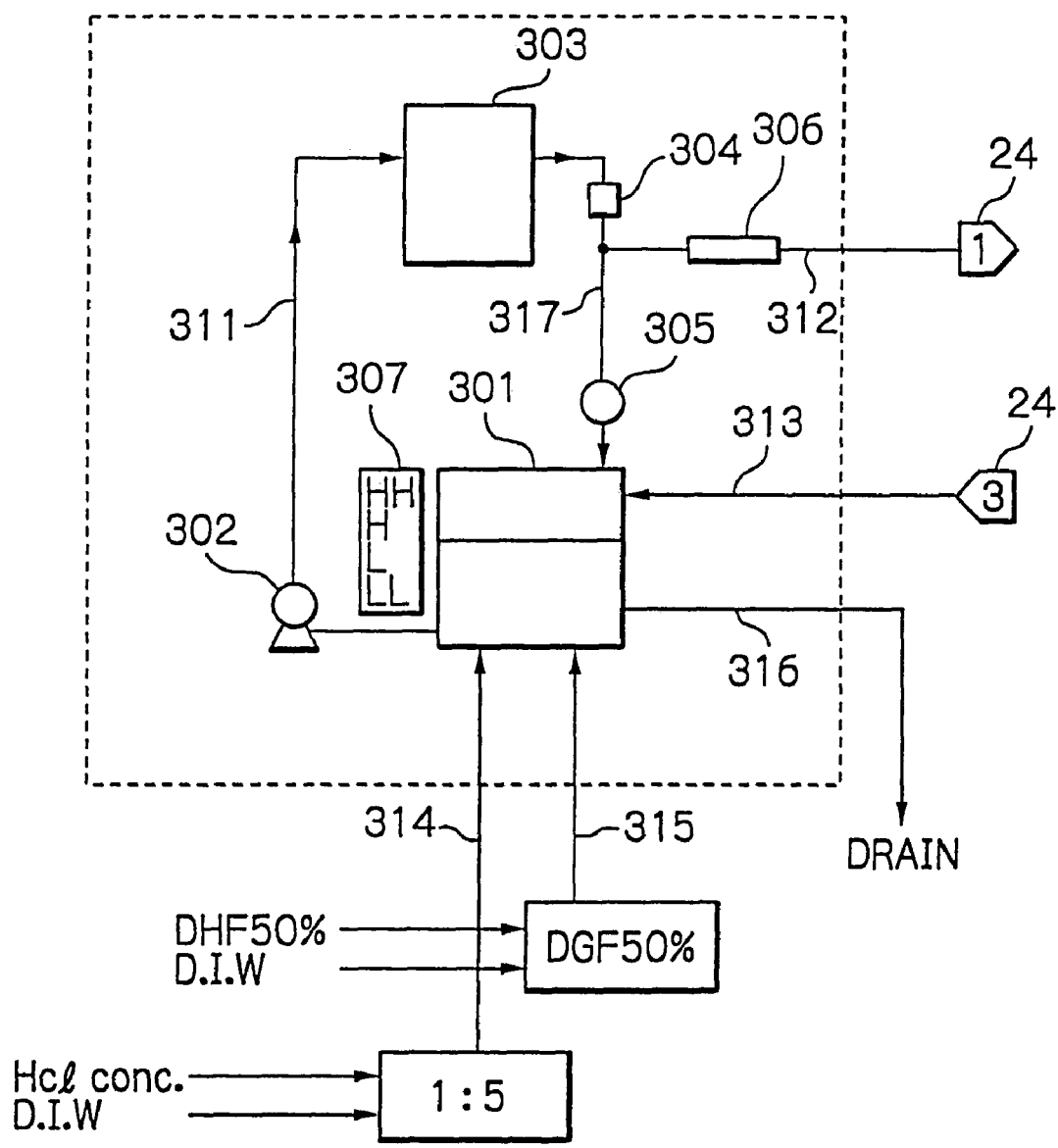
FIG. 7 is a flow diagram illustrating a liquid supply system for supplying DHF or hydrochloric acid.
Figure 8:
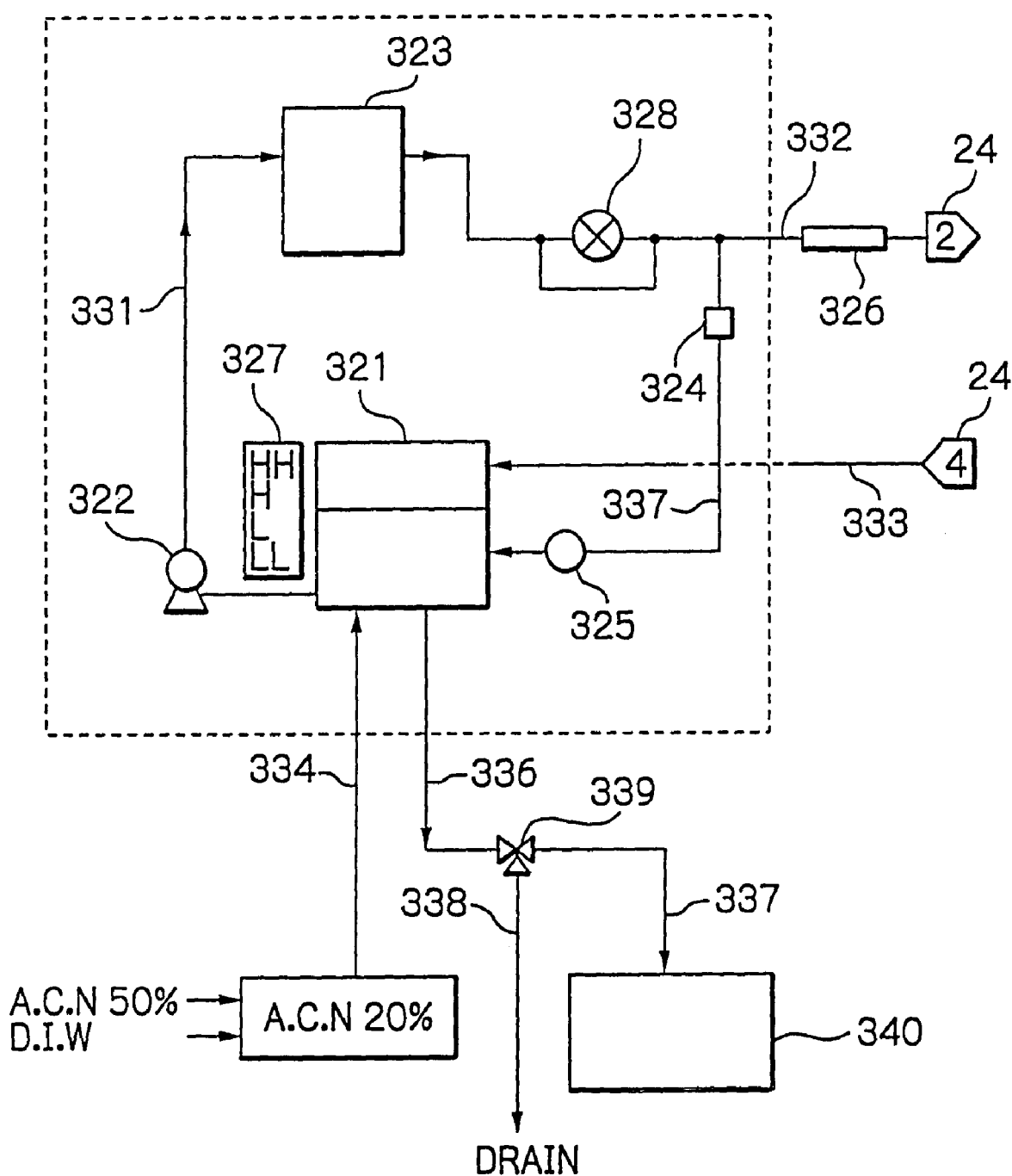
FIG. 8 is a flow diagram illustrating a liquid supply system for supplying A.C.N.
Figure 9:
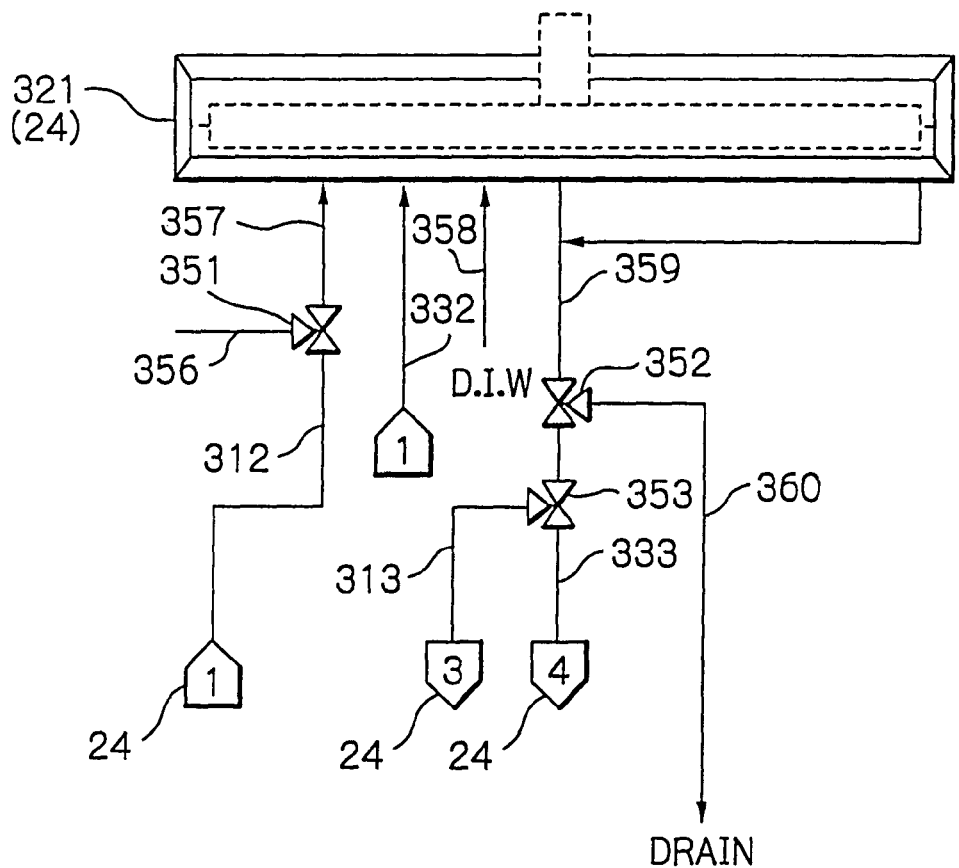
FIG. 9 is a flow diagram illustrating lines around the etching unit.

Now referring to flow diagrams of FIGS. 7, 8 and 9, a liquid supply system, that is, an etchant reservoir tank and its peripheral devices, for supplying the etchant to the etching unit of the embodiment according to the present invention will now be described. The unit according to the present invention allows three kinds of etchant to be selectively supplied. A first etchant is dilute hydrofluoric acid (DHF), a second etchant is dilute hydrochloric acid, and a third etchant is a solution of ammonium cerium nitrate. In this group, the dilute hydrofluoric acid (DHF) and the dilute hydrochloric acid are liquids that are not precipitated, but the ammonium cerium nitrate is a solution to be precipitated. The reservoir tank system may be constituted differently depending on the etching solution being precipitated or not precipitated.

With reference to the flow diagram of FIG. 7, a supply system of the etchant that is not precipitated or hardly precipitated will be explained. A liquid pressure pumping line 311 for taking out the etchant from an etchant reservoir tank 301 and for returning it to the reservoir tank 301 is arranged with its inlet port coupled to a lower portion of the reservoir tank 301. In the pressure pumping line 311, a pump 302 for pressure-pumping the etchant, a heater 303 for heating the etchant, and a flow meter 304 for measuring the flow rate of the etchant flowing through the pressure pumping line 311 are respectively installed in this sequence as starting from the side of the reservoir tank 301.

The pressure pumping line 311 is branched at a downstream side of the flow meter 304 into an etchant supply line 312 leading to an etching bath 24(1) of the etching unit and an etchant circulation line 317 leading to the etchant reservoir tank 301. The etchant circulation line 317 is provided with a conductivity meter 305 for measuring a conductivity of the etchant circulating without being supplied to the etching bath. The conductivity meter 305 is a measuring instrument for use in determining a concentration of the etchant by measuring the conductivity. This is based on the fact that there is a correlation between the conductivity and the concentration of the etchant. The etchant circulation line 317 in its return side is connected to an upper portion of the reservoir tank 301.

Further, a liquid level sensor 307 for monitoring the liquid level of the etchant within the reservoir tank 301 is installed outside of the reservoir tank 301.

Further, a dilute hydrochloric acid make-up line 314 for replenishing the reservoir tank 301 with the dilute hydrochloric acid and a dilute hydrofluoric acid make-up line 315 for replenishing the reservoir tank 301 with the dilute hydrofluoric acid are connected to the etchant reservoir tank 301. In addition, a drainage line (DRAIN) 316 for discharging the etchant in the etchant reservoir tank 301 is connected to the bottom portion of the etchant reservoir tank 301.

An operation of an etchant reservoir tank system equipped with above components will be described. First, an etchant to be used, for example, a solution of DHF by 5% is made from a solution of DHF by 50% mixed with deionized water (D.I.W.) and the etchant reservoir tank is filled with a predetermined amount of the etchant. A filling amount of the etchant can be monitored by the liquid level sensor 307. The liquid level sensor 307 is designed such that a highest level HH, a higher level H, a lower level L and the lowest level LL can be detected. An acceptable amount is determined as an intermediate level between the level H and the level L.

When the DHF etchant is used, the valve, which is not shown, should be closed with respect to the hydrochloric acid make-up line 314.

Once the reservoir tank fills with an appropriate amount of etchant, the pump 302 is actuated to start pressure-pumping of the etchant. The etchant pumped out of the pump 302 is heated by the heater 303 to a predetermined temperature required in the etching unit. The flow meter 304 can measure the flow rate of the etchant flowing through the pressure pumping line.

The etchant heated by the heater is supplied to the etching bath 24(1) in the etching unit, which will be explained later in detail, through the supply line 312 to the etching bath 24(1). At that time, a flow rate control valve 306 controls the flow rate of the etchant to a level required in the etching bath. Further, as will be explained later, any DHF etchant overflow in the etching bath or discharged from the discharge port can be returned to the bath through the return line 313 from an etching bath 24(3). In this way, the DHF etchant may be recovered and reused. Since the etchant is expensive, it is important for it to be able to be reused. This is an efficient use of resources.

While no etchant is supplied to the etching bath, the etchant temperature is maintained at the constant level by circulating the etchant from the pressure pump 302 through the heater 303, the flow meter 304, and the conductivity meter 305 to the reservoir tank 301. It is to be noted that a filter, which is not shown, may be installed in the pressure pumping line 311, for example, downstream to the heater 303. This filter may help remove the etching products or the like in the line. Further, since the water content in the etchant may be vaporized due to the circulation of the etchant or the etchant composition may be changed due to the etching reaction, the unit has been equipped with a function for managing the etchant by measuring the amount of the etchant using the liquid level sensor 307 arranged in the reservoir tank 301 and by measuring the concentration of the etchant using the conductivity meter 305 arranged in the line and thereby to replenish the reservoir tank 301 with the etchant or the deionized water.

To explain in more detail, the reason why the concentration of the etchant can be known by measuring the conductivity of the circulating etchant using the conductivity meter 305 is that the decreased conductivity could be determined due to the decreased concentration. When the conductivity decreases, the make-up line supplies new DHF etchant in order to increase the conductivity to the certain level corresponding to the concentration level required by the etching unit. Upon this adjustment, if the liquid level of the reservoir tank 301 has increased excessively, then the etchant may be discharged via the drainage line 316.

To the contrary, in the event of higher conductivity, the deionized water should be refilled. Although there is a possibility of the water content in the etchant being vaporized, resulting in a higher concentration of the etchant becomes higher, the liquid sensor 307 monitoring the liquid level can detect this event and the deionized water should be accordingly refilled to maintain the predetermined level of the concentration. That is, the use of the liquid level sensor 307 or the conductivity meter 305 can help maintain the concentration at an acceptable level. The use of these components in combination enables more accurate control of the concentration. These functions make it possible to reuse the enchant.

When the etching process has been completed and the used etchant is to be discharged from the reservoir tank 301, a valve installed in the line 316, though not shown, is opened. Although the same unit may be used for the DHF and also for the hydrochloric acid, if a different etchant is to be used, the reservoir tank 301 and its associated lines should be cleaned thoroughly with the deionized water to remove the previously used enchant.

It is to be appreciated that when this etchant supply system is used for the hydrochloric acid, the etchant should not be returned to the reservoir tank 301 through the return line 313 but the etchant after being used in the etching bath should be recovered into a tank, which is not shown, and the reservoir tank 301 be refilled with new enchant.

Now referring to the flow diagram of FIG. 8, a liquid supply system for the etchant to be precipitated will be explained. A liquid pressure pumping line 331 for taking the enchant out from an etchant reservoir tank 321 and for returning it back to the reservoir tank 321 is arranged with its inlet port coupled to a lower portion of the reservoir tank 321. In the pressure pumping line 331, a pump 322 for pressure-pumping the etchant, a heater 323 for heating the etchant, and a filter 328 for filtering the etchant are respectively installed in this sequence as starting from the side of the reservoir tank 321.

The pressure pumping line 331 is branched at a downstream side of the filter 328 into an etchant supply line 332 leading to an etching bath (liquid bath) 24(2) of the etching unit and an etchant circulation line 337 leading to the etchant reservoir tank 321. The etchant circulation line 337 is provided with a flow meter 324 for measuring a flow rate of the etchant flowing through the circulation line 337 and a conductivity meter 325 for measuring a conductivity of the etch ant circulating without being supplied to the etching bath 24.

The conductivity meter 325, similar to the conductivity meter 305, is a measuring instrument to be used for determining a concentration of the etchant by measuring conductivity. The etchant circulation line 337 in its return side is connected to an upper portion of the reservoir tank 321. It is to be appreciated that the flow meter 324 may be installed in the pressure pumping line 331 as in the case described with reference to FIG. 7.

Further, a liquid level sensor 327 for monitoring the liquid level of the etchant within the reservoir tank 321 is installed outside the reservoir tank 321.

Further, an A.C.N. make-up line 334 for replenishing the reservoir tank 321 with ammonium cerium nitrate (A.C.N.) is connected to the etchant reservoir tank 321. In addition, a drainage line (DRAIN) 336 for discharging the etchant contained in the etchant reservoir tank 321 is connected to a bottom portion of the etchant reservoir tank 321, and the drainage line 336 is connected to a three-way valve 339, one port of which is connected to the recovery line 337 leading to an A.C.N. recovery tank 340 and the other port of which is connected to a drainage line 338.

An operation of an etchant reservoir tank system equipped with above components will be described. First, an etchant to be used, i.e., a solution of A.C.N. by 20%, is made from a solution of A.C.N., for example, by making a mixture containing 50% deionized water (D.I.W.), and the etchant reservoir tank is filled with a predetermined amount of the etchant. The filling of the etchant can be monitored by the liquid level sensor 327. An acceptable amount of the etchant is determined as an intermediate level between the level H and the level L in the scale of the liquid level sensor 327.

When the reservoir tank has been filled with the acceptable amount of the etchant, the pump 322 is actuated to start the pressure-pumping of the etchant. The pumped-up etchant is heated by the heater 323 to a predetermined temperature required in the etching unit. The heated etchant passes through the filter 328, so that the etching products or the like can be removed therefrom.

The etchant heated by the heater 323 to an appropriate temperature, and further filtered by the filter 328 to be purified is supplied to the etching bath 24(2) through the supply line 332 to the etching bath 24(2). At that time, a flow rate control valve 326 controls the flow rate of the etchant. Further, any etchant overflowed in or discharged from the etching bath 24(4) may be returned to the reservoir tank 321 through a return line 333. In this way, the etchant can be recovered and reused.

At the time that no etchant is being supplied to the etching bath 24(2), the etchant temperature is maintained constant by circulating the etchant from the pressure pump 322 through the heater 323, the filter 328, the flow meter 324, and the conductivity meter 325 to the reservoir tank 321. It is true in this case, as similar to that of FIG. 7, that the acceptable concentration level of the etchant can be maintained by the use of the liquid level sensor 327 and/or the conductivity meter 325.

The three-way valve 339 is used when the etching has been completed and the used etchant is to be discharged out of the reservoir tank 321. When the three-way valve 339 is operated to establish a communication between the line 336 and the line 338, the etchant is allowed to drain to the outside, while on the other hand when the three-way valve 339 is operated to establish communication between the line 336 and the line 337, the etchant can be recovered into the A.C.N. recovery tank 340.

With reference to the flow diagram of FIG. 9, a configuration and operation of the etching unit to be supplied with the etchant from the etchant supply system described above will now be described. Herein, the etching bath 221, which has been described with reference to FIG. 6, is used as the etching bath.

A DHF/hydrochloric acid hydrogen peroxide water line 357, an A.C.N. line 332, a deionized water (D.I.W.) line 358 and a drainage line 359 are respectively connected to the etching bath 221. In the line 357, a three-way valve 351 functioning as a mixing valve is installed in a location just before an inlet port into the etching bath 221. Two of the ports of the three-way valve 351 are respectively connected to the supply line 312, which has been described with reference to FIG. 7, and to the hydrogen peroxide water supply line 356.

The three-way valve 351 has been designed as a mixing valve that can be switched between one case where the line 312 is in communication with the line 357 while blocking the line 356 and the other case where both of the line 312 and the line 356 are in communication with the line 357. When the line 312 is used to supply the DHF, the three-way valve 351 is switched to the other case so that the hydrogen peroxide water can be supplied from the line 356 to be mixed with the DHF, and when the line 312 is used to supply the hydrochloric acid, the three-way valve 351 is switched to the one case to block the line 356.

The A.C.N. line 332 is a line for supplying the A.C.N. which has been heated and filtered as described with reference to FIG. 8. The deionized water (D.I.W.) line 358 is a line for supplying the deionized water to clean the etching bath and so on if desired.

The drainage line 359 is a joint line of the lines from the ports 223a and 223b described with reference to FIG. 6 and connected to a three-way valve 352. One of the ports of the three-way valve 352 is connected with a drainage line 360, through which the used acid, alkali and DHF are drained. Another one of the ports of the three-way valve 352 is connected to another three-way valve 353. One of the ports of the three-way valve 353 is connected with the return line 313 running from the etching bath 24(3) to the reservoir tank 301 as described with reference to FIG. 7, and another one of the ports is connected with the return line 333 running from the etching bath 24(4) to the reservoir tank 321.

The three-way valves 352, 353 can switch lines depending on the liquid to be used. It is to be noted that the two three-way valves may be replaced with a single four-way valve which can switch the line 359 to be in communication with either of the lines 313, 333 or 360.

The relationship between the film to be etched and the etchant in the etching unit described above may be, for example, as described below.

For an Ru film, a solution of ammonium cerium nitrate by 20% is supplied as the etchant at a temperature of 80° C. This etchant may be used while circulating.

For a film of $Ta_2O_5$, a solution of dilute hydrofluoric acid by 50% at 80° C. may be supplied as the etchant. This etchant may be used while circulating.

For a TiN film, a solution of hydrochloric acid mixed with hydrogen peroxide water by a ratio of 1:1.5 at a temperature of 65° C. to 70° C. is supplied as the etchant. After having been used in the etching bath, this etchant is stored in the etchant reservoir tank to be subjected to a treatment as a drain liquid. The hydrogen peroxide water should be mixed with the hydrochloric acid just before the etching bath (mixing at a use point).

As has been described above, according to an etching unit of an embodiment of the present invention, by using a vacuum suction member 48 or 148, it is possible to prevent a region on the wafer within the vacuum suction member from coming into contact with the etchant and in particular, can shield a circuit section formed on the wafer completely from the enchant.

Figure 10:
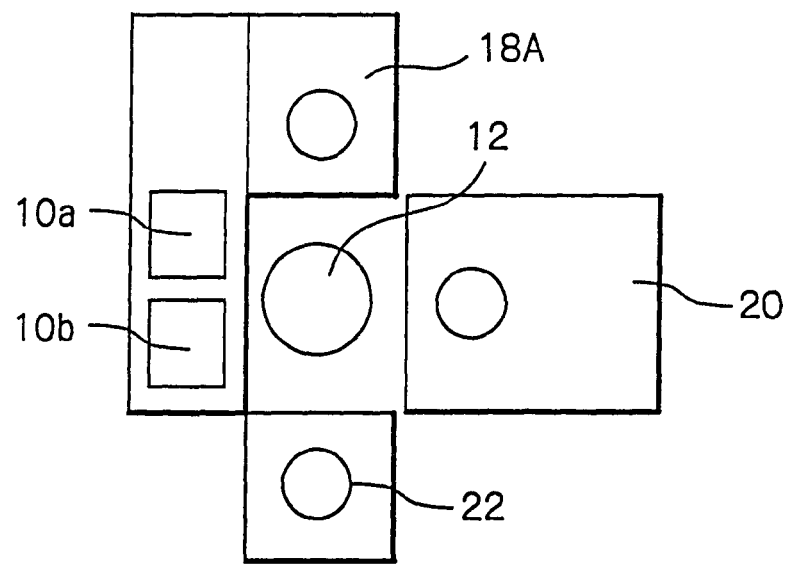
FIG. 10 is a plan view, illustrating a general configuration of an etching apparatus of another embodiment according to the present invention.

FIG. 10 shows a general configuration of an etching apparatus of another embodiment in which a cleaning unit and a drying unit are integrated to be a single cleaning/drying unit 18A. This may be achieved by, for example, providing a spin-dryer with a deionized water injecting means. Thereby, the number of units can be decreased by one and all of the units can be arranged surrounding the robot 12, so that a set of the units has been successfully made compact with the robot 12 of a fixed type. Further, owing to the elimination of travel of the wafer W between the cleaning unit and the drying unit, the process time can be shortened.

It is to be noted that although the above explanation has been given illustratively to the embodiment where the holding unit of the wafer according to the present invention is applied to the etching process, the application thereof is not limited to this, and this holding unit may be applied broadly to a variety of surface processing apparatuses including those for cleaning, drying and so on using a processing media of liquid or gas. Further, since in this holding unit, a substrate can be held stably by applying a vacuum suction to a peripheral portion of the substrate, this unit may be employed in such an apparatus that requires a mechanical holding strength for polishing the wafer W or the like.

According to the present invention as described above, since a holding unit comprises a vacuum suction member which comes into contact with an edge of one surface of the substrate and sucks the substrate, it can hold the substrate stably with the other surface of the substrate, a circumferential portion of the substrate, and especially a peripheral portion, for example, a bevel portion of the one surface being exposed. Accordingly, the surfaces can be processed with these portions exposed.

For example, after a film forming process such as CVD, sputtering or plating, if the wafer is held at its top surface and the etching and/or cleaning is applied to that surface, any undesirable films on the back surface and the circumferential portion, specifically the bevel portion, can be removed at the same time, thus reducing a processing time, and also ensuring uniform processing at those locations.

What is claimed is:

1. A holding unit for holding a substrate, said holding unit comprising:
    a holder plate; and
    a vacuum suction member adapted to be brought into contact with a peripheral portion of a surface of the substrate to suck the substrate, said vacuum suction member having no contact with regions of the substrate other than the peripheral portion,
    wherein said holder plate, said vacuum suction member and the substrate define a space which can be purged by blowing $N_2$ gas thereinto so that etchant is prohibited from entering into the space during processing of the substrate, and
    wherein said holder plate has a purging aperture for blowing the $N_2$ gas into the space defined by said holder plate, said vacuum suction member and the substrate, said purging aperture being connected to a $N_2$ source by a tube located in a cylindrical rotary shaft mounted to said holder plate.

2. A holding unit of claim 1, wherein said vacuum suction member is shaped so as to surround an element forming region of the substrate, thereby preventing processing from being applied to the element forming region.

3. A holding unit of claim 1, wherein said vacuum suction member has an annular groove and an exhaust path formed therein, said annular groove being open in a side facing the substrate, and said exhaust path opening to said annular groove.

4. A holding unit of claim 3, wherein said annular groove is substantially V-shaped.

5. A holding unit of claim 3, wherein said annular groove is substantially rectangular shaped.

6. A holding unit of claim 1, wherein a material forming a portion of said vacuum suction member to be brought into contact with the substrate has a hardness lower than that of the substrate.

7. A processing apparatus for processing a substrate, said processing apparatus comprising:
    a holding unit of claim 1; and
    a surface processing unit for processing another surface of the substrate held by said holding unit.

8. A processing apparatus of claim 7, further comprising a unit operable to perform at least one of cleaning and drying of the substrate.

9. A processing apparatus of claim 7, further comprising a dipping bath for dipping the substrate held by said holding unit.

10. A processing apparatus of claim 7, further comprising an evaluation unit operable to check a condition of the substrate after processing and to determine a resultant condition achieved by processing the other surface of the substrate.

11. A holding unit of claim 1, wherein said vacuum suction member comprises at least two ring-shaped members forming at least one annular groove therebetween, said annular groove being open in a side facing the substrate.

* * * * *